United States Patent
Smalen et al.

(10) Patent No.: US 8,379,384 B2
(45) Date of Patent: Feb. 19, 2013

(54) COOLING STRUCTURE FOR ELECTRONIC DEVICE, AND A METHOD

(75) Inventors: Matti Smalen, Klaukkala (FI); Timo Koivuluoma, Vantaa (FI); Matti Laitinen, Kirkkonummi (FI)

(73) Assignee: ABB Oy, Helsinki (FI)

( * ) Notice: Subject to any disclaimer, the term of this patent is extended or adjusted under 35 U.S.C. 154(b) by 133 days.

(21) Appl. No.: 13/080,191

(22) Filed: Apr. 5, 2011

(65) Prior Publication Data

US 2011/0198064 A1    Aug. 18, 2011

Related U.S. Application Data

(63) Continuation of application No. PCT/FI2009/050792, filed on Oct. 1, 2009.

(30) Foreign Application Priority Data

Oct. 8, 2008    (FI) ..................................... 20085945

(51) Int. Cl.
*H05K 7/20*    (2006.01)
(52) U.S. Cl. .................... 361/679.51; 361/691; 361/692; 454/184; 312/223.2; 312/236; 165/104.33
(58) Field of Classification Search ............ 361/679.46–679.51, 676, 688–697, 831
See application file for complete search history.

(56) References Cited

U.S. PATENT DOCUMENTS

| | | | |
|---|---|---|---|
| 5,091,823 A | | 2/1992 | Kanbara et al. |
| 5,424,915 A | * | 6/1995 | Katooka et al. ................ 361/695 |
| 5,694,294 A | * | 12/1997 | Ohashi et al. ............ 361/679.48 |
| 6,618,248 B1 | * | 9/2003 | Dalheimer ............... 361/679.33 |
| 7,079,379 B2 | * | 7/2006 | Yamaguchi et al. .......... 361/676 |
| 7,218,517 B2 | * | 5/2007 | Wolford et al. ............... 361/695 |
| 7,248,471 B2 | * | 7/2007 | Wabiszczewicz ............. 361/694 |
| 7,817,419 B2 | * | 10/2010 | Illerhaus ....................... 361/692 |
| 7,848,101 B2 | * | 12/2010 | Dey et al. ................ 361/679.51 |
| 8,159,820 B2 | * | 4/2012 | Ibori et al. ..................... 361/695 |
| 2002/0081961 A1 | | 6/2002 | Foley et al. |
| 2007/0064390 A1 | | 3/2007 | Yeh et al. |
| 2007/0215329 A1 | | 9/2007 | Schwab |
| 2007/0230119 A1 | | 10/2007 | Baldwin, Jr. |
| 2009/0168346 A1 | | 7/2009 | Miyoshi |
| 2012/0014063 A1 | * | 1/2012 | Weiss ........................... 361/697 |

FOREIGN PATENT DOCUMENTS

| | | |
|---|---|---|
| DE | 2 151 010 A1 | 4/1973 |
| DE | 20 2004 015168 U1 | 12/2004 |
| EP | 0 356 991 A2 | 3/1990 |
| EP | 1 885 169 A1 | 2/2008 |

(Continued)

OTHER PUBLICATIONS

International Search Report (PCT/ISA/210) for PCT/FI2009/050792 dated Feb. 12, 2010.

(Continued)

*Primary Examiner* — Courtney Smith
(74) *Attorney, Agent, or Firm* — Buchanan Ingersoll & Rooney PC

(57) ABSTRACT

This disclosure relates to a cooling structure for an electronic device including an inlet for conveying a flow in a first flow direction towards a first component and an outlet for conveying the flow further. To deter dirt particles from proceeding to electronic components, the cooling structure can include a second flow channel, which starts from a port oriented transversely to the first flow direction or away therefrom and receives part of the flow from the inlet, and which conveys the part of the flow to an electronic component located in the second flow channel.

10 Claims, 5 Drawing Sheets

FOREIGN PATENT DOCUMENTS

| | | |
|---|---|---|
| GB | 2 369 249 A | 5/2002 |
| JP | 63-287343 A | 11/1988 |
| JP | 6-152170 A | 5/1994 |
| JP | 10-023618 A | 1/1998 |
| WO | WO 2008/084632 A1 | 7/2008 |

OTHER PUBLICATIONS

Finnish Search Report for FI 20085945 dated Aug. 26, 2009.

* cited by examiner

COOLING STRUCTURE FOR ELECTRONIC DEVICE, AND A METHOD

RELATED APPLICATION

This application claims priority as a continuation application under 35 U.S.C. §120 to PCT/FI2009/050792, which was filed as an International Application on Oct. 1, 2009 designating the U.S., and which claims priority to Finish Application 20085945 filed in Finland on Oct. 8, 2008. The entire contents of these applications are hereby incorporated by reference in their entireties.

FIELD

The present disclosure relates to a cooling structure for an electronic device and, for example, to preventing dirt particles from proceeding to electronic components.

BACKGROUND INFORMATION

In locations where the environment of an electronic device includes dirt particles, a cooling flow is provided in which particles that can affect the operation and reliability of the electronic device are not deterred from proceeding to electronic components.

In known cooling structures the flow can be conveyed through one or more filters before the filtered flow is allowed to proceed to the electronic components. The filter can become fouled unless changed at intervals. In view of the costs, it is desirable that the filters would not need replacement at all or at least that the replacement interval would be as long as possible.

SUMMARY

A cooling structure for an electronic device is disclosed. The structure comprises an inlet for receiving and conveying a flow in a first flow direction towards a first component located in a first flow channel; an outlet for conveying the flow from the first component located in the first flow channel; and a second flow channel, which starts from a port oriented transversely to the first flow direction or away from the first flow direction, the part being located upstream of the first component for receiving part of the flow from the inlet and for conveying the part of the flow to an electronic component located in the second flow channel, and wherein the second flow channel includes an intermediate space and a component space separated from one another by a partition wall, the intermediate space being located at a beginning of the second flow channel for communicating with the component space through an opening in the partition wall, and an area of the port, through which the flow will enter the intermediate space, being smaller than an area of the opening in the partition wall, through which the flow will pass from the intermediate space into the component space.

A method for providing a cooling flow for an electronic component is disclosed. The method comprises separating a secondary flow from a main flow with a port oriented transversely to a first flow direction or away from the first flow direction; conveying the secondary flow through a component space housing an electronic component to an outlet, the secondary flow being conveyed into the component space through an intermediate space, the component space being separated from the intermediate space by a partition wall; and reducing a flow rate of the secondary flow in the intermediate space located upstream of the component space by conveying the secondary flow into the intermediate space through a port whose area is smaller than an area of an opening through which the secondary flow is conveyed from the intermediate space to the component space.

BRIEF DESCRIPTION OF THE DRAWINGS

In the following the disclosure will be described in greater detail, by way of example, with reference to the attached drawings, in which.

DETAILED DESCRIPTION

The disclosure relates to reducing the amount of dirt particles finding their way to electronic components of an electronic device.

In an exemplary embodiment of the disclosure, the flow can be divided into at least two branches. The main flow can be allowed to proceed in a first flow direction into a first flow channel, where dirt particles, if any, contained in the flow are not able to cause significant harm. From the main flow, a flow that is secondary to the main flow is separated into a second flow channel by a port that is oriented transversely to the first flow direction or away from the first flow direction. Due to this arrangement the largest and heaviest dirt particles can continue to proceed in the first flow direction past the port. The flow entering the second flow channel can first be conveyed into an intermediate space and only thereafter into a component space. The flow ending up to the component space can be considerably cleaner than the flow ending up in the first flow channel.

In an exemplary embodiment of the disclosure, the surface area of a port through which the flow in the second flow channel enters an intermediate space can be smaller than the surface area of an opening in a partition wall between the intermediate space and the component space, through which the flow passes from the intermediate space into the component space of the second flow channel. The flow rate decreases in the intermediate space. Because of the low flow rate, the flow does not carry the dirt particles along with the flow from the intermediate space onwards. Instead they remain in the intermediate space. The flow reaching the electronic components can be cleaner and the dirt particles accumulated in the intermediate space can be subsequently removed from the intermediate space, for example, in connection with maintenance.

It should be noted that even though this application refers to a port and an opening in a partition wall, the openings in question may be multi-sectional. For example, instead of one large opening they may include several smaller openings.

Figure 1:
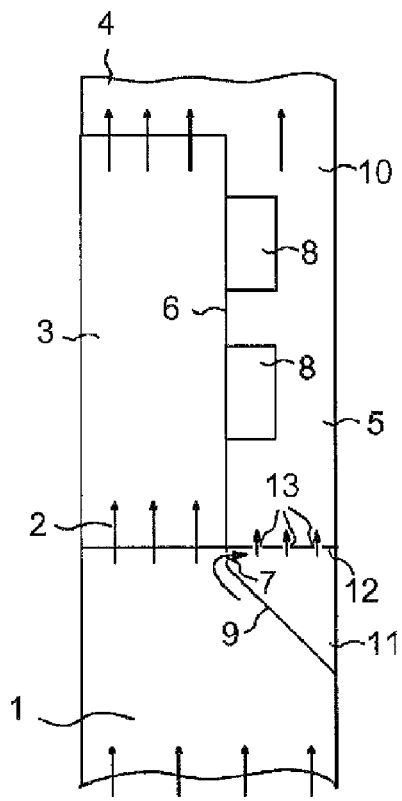
FIG. 1 illustrates an exemplary embodiment of a cooling structure and a method in accordance with the disclosure.

FIG. 1 illustrates a first exemplary embodiment of a cooling structure in accordance with the disclosure. The cooling structure of FIG. 1 includes an inlet 1 for receiving an air flow, for example, from a room space around an electronic device, and for conveying this air flow further in a first flow direction 2 towards a component 3 located in a first flow channel. In the following it is assumed, by way of example, that the component 3 is a cooling element by which the air flow flowing in the first flow channel cools components in connection with the cooling element. If the electronic device in question is a frequency converter, for instance, it is possible to attach power semiconductors to be cooled to the cooling element.

The main flow flowing through the component 3 proceeds further from the first flow channel towards an outlet 4 of the cooling structure, through which the flowing air may return, for example, to the room space around the electronic device.

The cooling structure of FIG. 1 includes a second flow channel 5, which is separated from the first flow channel by a side plate 6 of the component 3 or, alternatively, a partition wall. In the case of FIG. 1, the second flow channel 5 starts from a port 7 that can be transverse to the first flow direction 2 and can be located in the upstream of the first component 3. The second flow channels receive part of the flow from the inlet 1. In the second flow channel 5 there can be arranged such electronic components 8 that should protect from fouling. If the electronic device in question is a frequency converter, for example, it is possible to arrange capacitors and a choke in the second flow channels. In the exemplary embodiment of FIG. 1, the second flow channel 5 can rejoin the first flow channel to have the same outlet 4. In this example, the flow resistance in the first flow channel can affect the amount of flow ending up in the second flow channel. For example, if the component 3 causes high flow resistance a larger portion of the flow ends up in the second channel than in the case where the component 3 causes lower flow resistance.

The port 7 arranged transversely to the first flow direction 2, i.e. the main flow, can be designed such that its width is relatively small in the first flow direction 2, and its length transverse to the first flow direction 2 exceeds the width. Because of the port 7 that is small in width, the largest dirt particles can be prevented from accessing the second flow channel 5 through the port due to their size. In addition, the orientation of the port 7 that is transverse to the first flow direction 2 can result in the largest and heaviest particles continuing their course along with the main flow past the port 7 by the effect of their kinetic energy. The port can be oriented exactly transversely to the first flow direction, whereby the air flow diverts its course 90 degrees to pass through the port. An exact 90-degree diversion in course is not necessary, however, but the same result (e.g., the largest and heaviest dirt particles continue past the port 7 without ending up in the second flow channel), can be achieved even though the diversion in course would not be exactly 90 degrees but nearly 90 degrees or more. The orientation of this kind can make it possible to avoid that large and heavy dirt particles proceeding from the inlet along with a flow that would hit the port directly.

In order to generate a flow the cooling structure of FIG. 1 can include a fan in connection with the inlet 1. In that case the pressure provided by the fan can generate a flow in the first and the second flow channels. Alternatively, there can be arranged a fan or fans in the first and/or the second flow channel after the first component 3 and the electronic component 8, respectively. In that case the partial vacuum generated by the fan or fans can generate a flow in the first and the second flow channels.

In the exemplary embodiment of FIG. 1, after the inlet 1 there can be arranged a guide plate 9 in an oblique position to the first flow direction 2 so as to reduce the cross-sectional area of the flow from the inlet 1. The port 7 can be arranged in the vicinity of the location where the cross-sectional area of the flow changes. In this example the location is where the change in the cross-sectional area ends (e.g., immediately after the guide plate 9). Because of the guide plate 9 a vortex can be generated at the port. By the effect of centrifugal force the largest particles continue to proceed along the main flow to the first component 3 in the first flow channel and only the smallest and lightest particles enter the second flow channel 5.

In the exemplary embodiment of FIG. 1, the second flow channel 5 includes a component space 10 and an intermediate space 11, which are separated from one another by a wall 12. The port 7, through which the flow is able to enter the second flow channel 5, can, in an exemplary embodiment, have a smaller surface area than the opening 13, through which the secondary flow in the second flow channel 5 is able to proceed from the intermediate space 11 to the component space 10. Consequently, the flow rate decreases in the intermediate space. Because of the lower flow rate the flow no longer carries dirt particles contained therein, but they remain in the intermediate space 11, wherefrom they may be subsequently removed, for example in connection with maintenance. The flow ending up in the component space can thus be still cleaner. The retention of dirt particles in the intermediate space can be enhanced, when the intermediate space has a turbulent air flow that enhances separation of dirt particles from the air flow.

Apart from the intermediate space 11 allowing adjustment of pressure loss in the second channel (by dimensioning of openings 7 and 13), the intermediate space may also be utilized as a location for a filter. For example, if it is desired that the device also utilizes, for example, a filter including a porous material or a cyclone, it is possible to arrange a filter of this kind in the intermediate space 11. In that case the replacement interval/cleaning interval can be longer than in known cooling structures, because major part of dirt particles will never even reach the filter located in the intermediate space.

It should be noted that even though this application refers to a port 7 and to an opening 13 in a partition wall, the openings in question can also be multi-sectional. For example, instead of one large opening they can include several smaller openings. The opening 13 in the partition wall 12 can make it possible to affect how the flow disperses in the wide component space 10. The use of the multi-sectional opening 13, which include a plurality of smaller openings, allows the air flow to disperse efficiently throughout the whole width of the component space 10 at desired places (for instance, exactly at the electric components).

Figure 2:
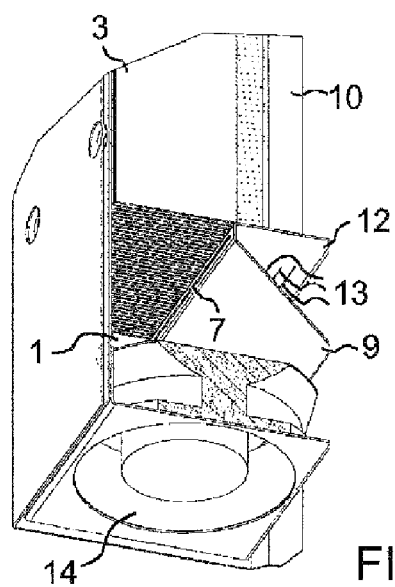
FIG. 2 illustrates an exemplary embodiment of a cooling structure in accordance with the disclosure.

FIG. 2 illustrates an exemplary embodiment of the cooling structure in accordance with the disclosure. The embodiment of FIG. 2 corresponds to the embodiment of FIG. 1, and therefore it is described in the following primarily by highlighting the differences between these embodiments.

In the exemplary embodiment of FIG. 2, in connection with an inlet 1 there can be arranged a fan 14 that produces an air flow at the inlet 1. In this exemplary embodiment, as well, a first and a second flow channel can be substantially parallel, for example, a component space 10, which is located downstream of an intermediate space of the second flow channel, is substantially parallel to the first flow channel housing a component 3. This is not necessary, however, in all embodiments. When the fan is located in connection with the inlet 1, the first and the second flow channels need not have a common outlet, but they may open up in the room space around the electronic device through different openings. Hence, they need not be substantially parallel either.

Figure 3:
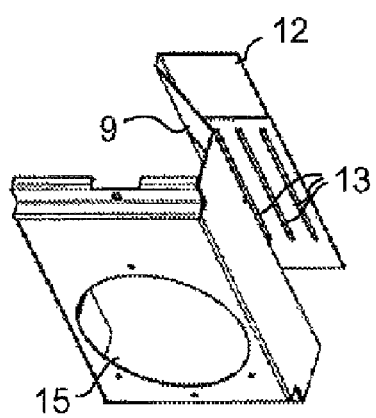
FIGS. 3 and 4 illustrate a guide that may be utilized in the embodiment of FIG. 2.
Figure 4:
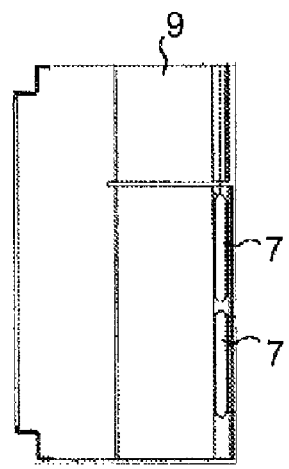

FIGS. 3 and 4 illustrate a guide that may be utilized in the embodiment of FIG. 2. In FIG. 3 the guide is seen obliquely from above, and in FIG. 4 seen from the right of FIG. 3.

The guide can be a part made of any suitable material such as sheet metal, for example, which forms the guide plate 9 and the partition wall 12 shown in FIG. 2 and which includes an opening 15 for the fan. It appears from FIG. 4 that the port 7, through which the flow enters the second flow channel, is multi-sectional, for example, it includes two narrow yet long (vertical length in FIG. 4) gaps. Correspondingly, it appears from FIG. 3 that also the opening 13, through which the flow passes from the intermediate space 11 to the component space 10, is multi-sectional. In this example the opening 13 includes three parallel gaps, the total surface area of which is larger than the total surface area of the multi-sectional port 7.

Figure 5:
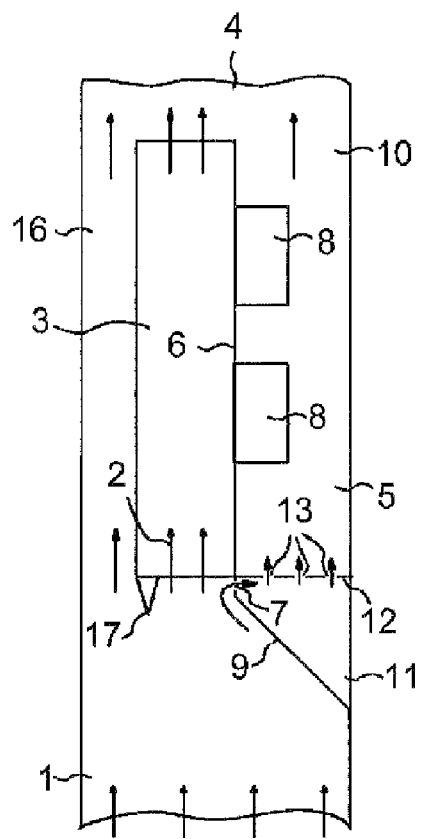
FIG. 5 illustrates an exemplary embodiment of a cooling structure in accordance with the disclosure.

FIG. 5 illustrates a third exemplary embodiment of the cooling structure in accordance with the disclosure. The embodiment of FIG. 5 corresponds to the embodiment of FIG. 1, and therefore it is described in the following primarily by highlighting the differences between these embodiments.

In the exemplary embodiment of FIG. 5 the cooling structure can further include a third flow channel 16, which in this example is substantially parallel to the first flow channel and the second flow channel 5. The third flow channel can be utilized for conveying an air flow to other components to be cooled than the cooling element 3 and the electronic components 8.

In the exemplary embodiment of FIG. 5, in the component 3 there is also arranged a guide 17, which contributes to distribution of the flow between the first, the second and the third flow channels.

Figure 6:
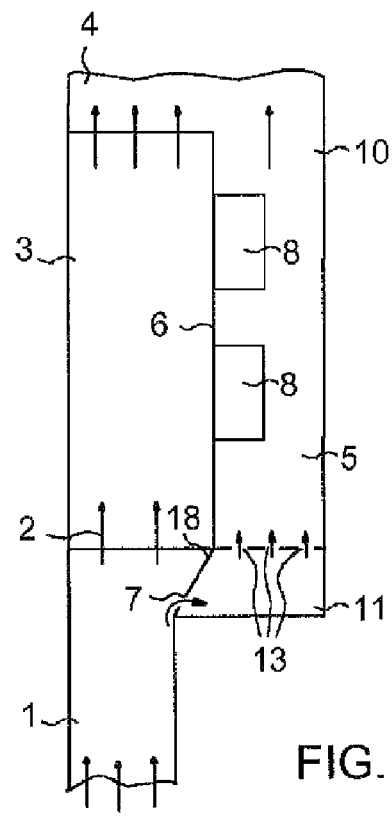
FIG. 6 illustrates an exemplary embodiment of a cooling structure in accordance with the disclosure.

FIG. 6 illustrates a fourth exemplary embodiment of the cooling structure in accordance with the disclosure. The embodiment of FIG. 6 corresponds to the embodiment of FIG. 1, and therefore it is described in the following primarily by highlighting the differences between these embodiments.

In the exemplary embodiment of FIG. 6, as well, the port 7 can be arranged in the vicinity of the point where the cross-sectional area of the flow from the inlet changes. Unlike in the preceding embodiments, the port 7 can be, however, at the location where the cross sectional area of the flow increases due to an oblique wall 18. Thus, the largest and heaviest dirt particles can continue to proceed in the first flow direction due to their kinetic energy, whereby a cleaner flow enters the intermediate space 11.

Figure 7:
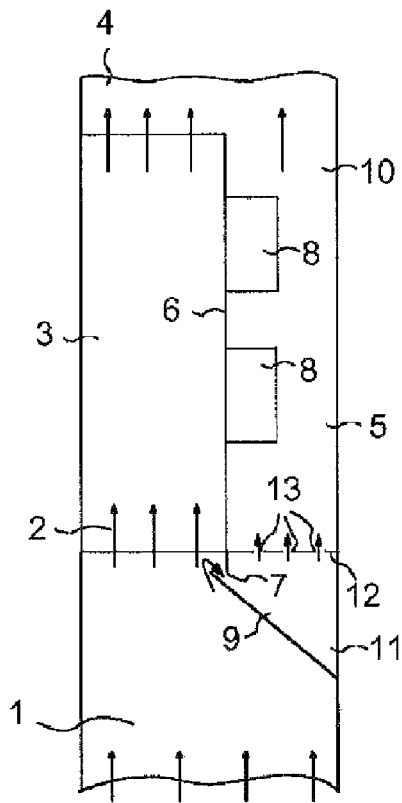
FIG. 7 illustrates an exemplary embodiment of a cooling structure in accordance with the disclosure.

FIG. 7 illustrates a fifth exemplary embodiment of the cooling structure in accordance with the disclosure. The embodiment of FIG. 7 corresponds to the embodiment of FIG. 1, and therefore it is described in the following primarily by highlighting the differences between these embodiments.

In the case of FIG. 7, the port 7 is not transverse to the first flow direction 2, but can be oriented still further away from the first flow direction. In this embodiment the air from the inlet 1 can be diverted considerably more than 90 degrees to enter the intermediate space through the port 7.

Figure 8:
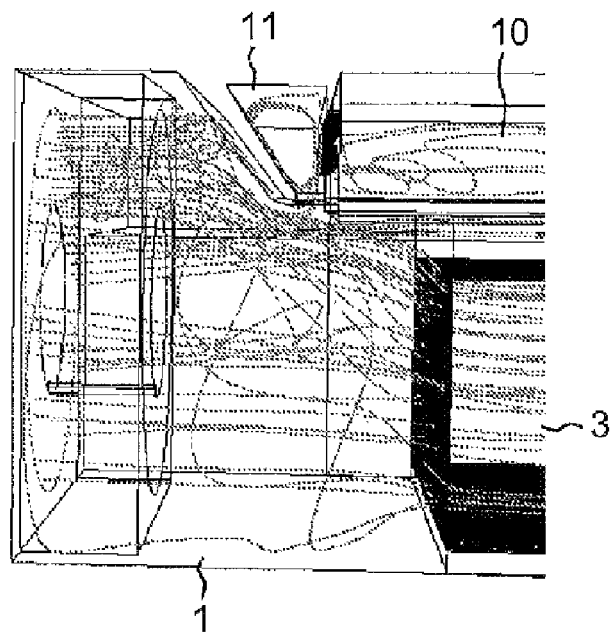
FIGS. 8 to 10 illustrate a flow of particles in exemplary embodiments of the cooling structure.
Figure 9:
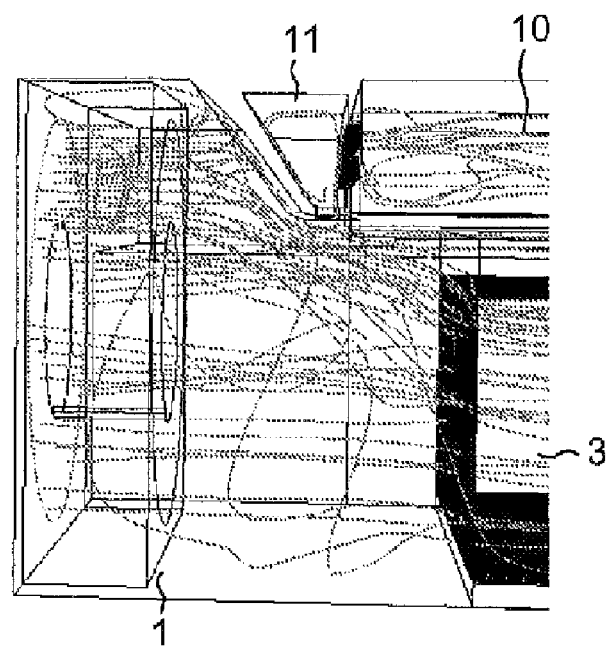
Figure 10:
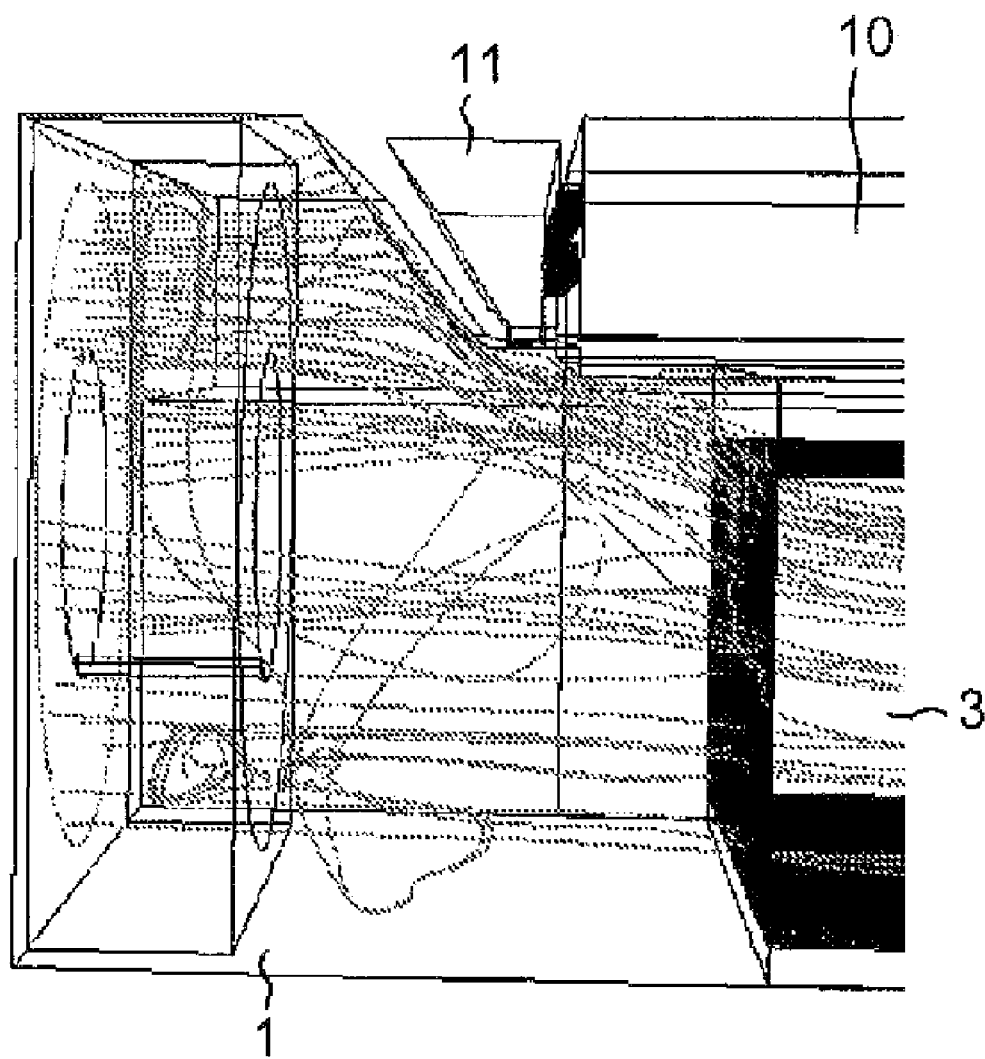

FIGS. 8 to 10 illustrate flow of particles in the cooling structure. FIGS. 8 to 10 simulate flow of ashes in the cooling structure of FIG. 2 by using particles of various sizes and by maintaining the conditions unchanged.

In the case of FIG. 8 the diameter of the particles is, for example, 1 μm, in the case of FIG. 9 the diameter of the particles is, for example, 10 μm and in the case of FIG. 10 the diameter of the particles is, for example, 20 μm. When FIGS. 8 to 10 are compared with one another, it can be noted that some of the smallest particles (FIG. 8) pass through the intermediate space 11 to the component space 10, but as the particle size increases, less particles will end up in the component space 10 (FIG. 9). The particle size being largest (FIG. 10), particles will no longer reach the component space 10. Thus, the structure manages to filter out the largest and most harmful particles from the flow to be conveyed to the component space.

Thus, it will be appreciated by those having ordinary skill in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A cooling structure for an electronic device, the structure comprising:
   an inlet for receiving and conveying a flow in a first flow direction towards a first component located in a first flow channel;
   an outlet for conveying the flow from the first component located in the first flow channel; and
   a second flow channel, which starts from a port oriented transversely to the first flow direction or away from the first flow direction, the port being located upstream of the first component for receiving part of the flow from the inlet and for conveying the part of the flow to an electronic component located in the second flow channel, and wherein
   the second flow channel includes an intermediate space and a component space separated from one another by a partition wall,
   the intermediate space being located at a beginning of the second flow channel for communicating with the component space through an opening in the partition wall, and
   an area of the port, through which the flow will enter the intermediate space, being smaller than an area of the opening in the partition wall, through which the flow will pass from the intermediate space into the component space.

2. The cooling structure of claim 1, wherein
   the second flow channel is substantially parallel to the first flow channel; and
   the first and the second flow channels having a common outlet for conveying the flow further from the first and the second flow channels.

3. The cooling structure of claim 1, wherein the port, from which the second flow channel starts, is located in a vicinity of a point where a cross-sectional area of the flow from the inlet will change.

4. The cooling structure of claim 1, wherein the port, from which the second flow channel starts, is located at a location where reduction in cross-sectional surface area of the flow from the inlet will end.

5. The cooling structure of claim 1, comprising:
   a guide plate arranged in an oblique position to the first flow direction so as to reduce a cross-sectional area of the flow from the inlet; and
   the port, from which the second flow channel starts, being arranged immediately downstream of the guide plate.

6. The cooling structure of claim 1, wherein the first component is a cooling element, by which the flow will cool electronic components in connection with the cooling element.

7. The cooling structure of claim 1, comprising:
   a fan for generating the flow.

8. The cooling structure of claim 1, comprising:
at least one fan arranged downstream of the first component in the first flow channel and the electronic component in the second flow channel, respectively, for generating a flow in the first and the second flow channels.

9. The cooling structure of claim 1, wherein the port, from which the second flow channel starts, has a first width in the first flow direction that is smaller than a length of the port transverse to the first flow direction.

10. A method for providing a cooling flow for an electronic component, the method comprising:
separating a secondary flow from a main flow with a port oriented transversely to a first flow direction or away from the first flow direction;

conveying the secondary flow through a component space housing an electronic component to an outlet, the secondary flow being conveyed into the component space through an intermediate space, the component space being separated from the intermediate space by a partition wall; and reducing a flow rate of the secondary flow in the intermediate space located upstream of the component space by conveying the secondary flow into the intermediate space through a port whose area is smaller than an area of an opening through which the secondary flow is conveyed from the intermediate space to the component space.

* * * * *